United States Patent [19]
Thomas et al.

[11] Patent Number: 5,913,425
[45] Date of Patent: Jun. 22, 1999

[54] COMPONENT CARRIER HAVING ANTI-REFLECTIVE POCKET

[75] Inventors: James R. Thomas; Clifton C. Haggard, both of Austin, Tex.; Qifang Yang, Handan; Song Ping Chen, Taiyuan, both of China; Mao Shi Khoo, Penang, Malaysia; Gang Wang, Shenzhen, China; Jason D. Brown, Austin, Tex.

[73] Assignee: Peak International, Inc., Austin, Tex.

[21] Appl. No.: 08/986,417

[22] Filed: Dec. 8, 1997

[51] Int. Cl.$^6$ ...................................................... B65D 73/02
[52] U.S. Cl. ............................................. 206/714; 206/725
[58] Field of Search ....................................... 206/713, 714, 206/725, 330, 332, 722; 361/212, 809, 810

[56] References Cited

U.S. PATENT DOCUMENTS

| | | |
|---|---|---|
| 3,465,874 | 9/1969 | Hugle et al. . |
| 4,966,281 | 10/1990 | Kawanishi et al. . |
| 5,076,427 | 12/1991 | Thomson et al. ......................... 206/714 |
| 5,226,226 | 7/1993 | Fierkens . |
| 5,234,104 | 8/1993 | Schulte et al. . |
| 5,333,733 | 8/1994 | Murata ..................................... 206/714 |
| 5,360,110 | 11/1994 | Hirai et al. . |
| 5,396,988 | 3/1995 | Skrtic . |
| 5,418,692 | 5/1995 | Nemoto . |
| 5,481,438 | 1/1996 | Nemoto . |
| 5,499,717 | 3/1996 | Hayashi . |
| 5,664,680 | 9/1997 | Hamlin . |

FOREIGN PATENT DOCUMENTS

| | | |
|---|---|---|
| 60-119798 | 8/1985 | Japan . |
| 61-214414 | 9/1986 | Japan . |
| 63-281979 | 11/1988 | Japan . |
| 2-048572 | 4/1990 | Japan . |
| 2-111524 | 4/1990 | Japan . |
| 2-219761 | 9/1990 | Japan . |
| 2-258573 | 10/1990 | Japan . |
| 3-038763 | 4/1991 | Japan . |
| 4-080890 | 7/1992 | Japan . |
| 4-201880 | 7/1992 | Japan . |
| 4-242581 | 8/1992 | Japan . |
| 5-061088 | 8/1993 | Japan . |
| 6-255673 | 9/1994 | Japan . |
| 7-149393 | 6/1995 | Japan . |
| 8-198317 | 8/1996 | Japan . |

*Primary Examiner*—Bryon P. Gehman
*Attorney, Agent, or Firm*—Fitzpatrick, Cella, Harper & Scinto

[57] ABSTRACT

A component carrier, for holding for purposes of automated visual inspection an electrical component having a lead with a free end, includes a carrier substrate and a pocket recessed in the substrate for holding the component in the interior of the pocket. The pocket includes a wall, depending from the carrier substrate and defining a lateral boundary of the pocket, and a bottom. There is a lead-tip horizontal plane and a lead-tip vertical plane when a correctly constructed component of the type the carrier is intended to hold is properly oriented in the pocket. The lead-tip vertical plane is perpendicular to a longitudinal axis of the pocket. The wall slopes down and inwardly at a first angle relative to the substrate through the lead-tip horizontal plane and at a second angle relative to the substrate through the lead-tip vertical plane. The first angle is greater than or equal to approximately 75° and less than or equal to 90°, and the second angle is less than 90° and not greater than the first angle.

51 Claims, 7 Drawing Sheets

COMPONENT CARRIER HAVING ANTI-REFLECTIVE POCKET

FIELD OF THE INVENTION

This invention relates to component carrier tapes or trays, and more particularly to an improved carrier tape or tray pocket designed to reduce detrimental reflections.

BACKGROUND OF THE INVENTION

Prefabricated components and chips lie at the heart of most analog and digital circuits. As these circuits become more prevalent and more complex, it has become increasingly important to those who manufacture and sell the component parts, as well as to those who purchase components and implement circuits using them, that these often delicate or sensitive components can be inspected efficiently and effectively, prior to installation. Similar demands exist with respect to other electrical and mechanical components.

Component suppliers traditionally ship their parts to the end user in various forms of transport packaging, the most popular being waffle trays or tape-and-reel arrangements.

In tape-and-reel arrangements, the tape is thermoformed of a thin layer of thermoplastic with a series of depressions or pockets formed along its length. A component part is inserted into a pocket and covered with a cover tape, which secures the part inside. The cover tape is usually a film or web with a thermally-activated or pressure-sensitive adhesive deposited on its underside. A length of the carrier/cover tape combination is then spooled onto a circular shipping reel. This system provides an efficient arrangement in which the components can be packaged, shipped and presented to an automated assembly process.

Waffle trays are similar, except the pockets are provided in a grid pattern on a thermoformed or injection molded tray. Instead of rolling the carrier onto a reel as with the tape, the trays are stacked for shipping and storage.

Circuit components are generally formed of a main body with a lead or one or more parallel series of leads extending from near the edges of the main body. In a typical component, the main body will be a regular parallelepiped (box-shaped), with sets of parallel leads extending out from one, two or four sides. When viewed from above, the longitudinal axis of each lead will be generally perpendicular to the side of the body from which it extends. The main body is generally more robust than the leads, and able to withstand forces typically encountered in formation, shipping and storage. The leads, however, are often quite delicate, and are more likely to be malformed or damaged during formation, shipping and storage.

Automated visual inspection ("AVI") systems have been developed for inspecting the leads while the component is within the carrier. The optics of a typical AVI system include an optical lens rested concentrically within a ring-shaped light source. The AVI system directs light from the ring light onto the carrier and component, either prior to affixation of the carrier cover, through the cover, or after removal of the cover. The AVI system electronically records an image through the lens of the entire carrier pocket and component therein, producing a gray-scale digital "snapshot". The AVI system then utilizes an algorithm to analyze the pixels in an inspection region in the digital snapshot (a two-dimensional region representative of a three-dimensional space surrounding the expected location of the ends of the leads and projected approximately perpendicular to the plane in which carrier cover normally lies) in order to identify light reflected back by the component. The typical AVI system interprets the location and brightness of the reflected light within the inspection region to determine whether the reflection pattern is consistent with leads that are properly formed.

An AVI system is generally designed to detect and interpret visible light (or other radiant energy) reflected directly by the component leads back toward the overhead lens. Such reflections may be referred to herein as "direct vertical reflections" or "direct return reflections". If the component is properly positioned in the inspection region, and the leads are properly constructed and have not been bent or broken, then the vertical reflections directly off the leads should all fall in a certain pattern a set distance from the component body. A typical lead, being metal, will create a brighter (or different wavelength) reflection than does the plastic carrier. Ordinarily, an AVI system will take an initial reading outside of the inspection region to determine where on the gray scale non-lead reflections will register. The system will then take a series of readings at discrete pixels or groups of pixels, located a predetermined distance apart, as it pans across the inspection region of the digital representation in a direction representative of the longitudinal axes of the leads being inspected, from the edge of the pocket toward the body of the component. Generally, the minimum longitudinal distance represented by each successive reading is equal to a pixel width, which is usually representative of about 0.05 millimeter. The system will typically be programmed to interpret the reception of a predetermined number of successive bright readings as indication of the presence of a lead.

However, an AVI system may also detect light reflected sideways by a non-horizontal surface of a component lead, such as a corner of the front edge of the lead, that rebounds vertically off the carrier. It may also detect light reflected directly upward by the carrier itself, at a corner. Either of these extraneous reflections can cause false or misleading readings. Thus, in order to improve the reliability of AVI systems, it is important to reduce the instances of extraneous reflections in the inspection region, or at least insure that any extraneous reflections are sufficiently removed from one another and the actual lead ends to avoid creating a false series of successive bright readings.

For example, FIG. 4A schematically shows a component C in a standard carrier pocket with rounded corners and near-vertical end walls. If an AVI system were inspecting the leads on the right side of the pocket (in this view), it would begin analyzing a digital representation of the pocket at a location depicting the right end of the pocket and scan toward the left, as if it were panning across the actual pocket in the direction indicated by the arrow in the figure. In this case, the first fairly bright reflection encountered would be a vertical reflection at the pocket edge (P1), which would be a false reading, as far as the presence of a lead is concerned. Next would be a vertical reflection at the corner between the pocket wall and the pocket floor (P2), which also would be a false reading. Next would be the first true reading, the vertical reflection near the end of the lead (P3). Because the pockets end wall is substantially vertical and spaced from the leads, for the sake of this illustration, it will be assumed that no sideways reflection off the lead rebounds from the end wall up to the AVI. While the reflection at P1 is separated by some distance from the reflection at the end of the lead (P3), the reflection at P2 is quite close to the reflection at P1, which could be incorrectly interpreted by an AVI system to indicate the beginning of the lead, which, were it true, might indicate that the lead is too long or is not properly bent. The result might be rejection of a component that is not defective at all.

As another example, FIG. 4B schematically shows a component C in another standard carrier pocket, this pocket having a more arcuate shape, with sloped end walls. If an AVI system were inspecting the leads on the right side of this pocket (in this view), it would begin analyzing a digital representation of the pocket at a location depicting the right end of the pocket and scan toward the left, as if panning across the actual pocket in the direction indicated by the arrow in the figure. As with the previous case, the first fairly bright vertical reflection encountered would be at the pocket edge (P1). However, the next reflections would be a pair of sideways reflections off the lead, that rebound vertically off the sloped end wall, back to the AVI system (P4, P5). In this case, the reflection at P4 is off the "elbow" of the lead, while the reflection at P5 is off the top edge along the front end of the lead. Next is the reflection directly off a horizontal portion of the lead, adjacent its front end (P3), then the reflection off the carrier at the location where the pocket "bottoms out" (P6). While the reflection at P1 is separated by some distance from the direct return reflection caused by the horizontal surface adjacent the end of the lead (P3), the "doublet" reflections at P4 and P5 are generally close enough to one another, and to the reflection at P3, to be incorrectly interpreted by an AVI system as indicating the beginning of the lead. An actual lead beginning at the point of the P4 reflection would either be too long or not properly bent. Therefore, the AVI system might again reject a component that is not defective.

Conversely, it is possible that a truly misshapen lead would create doublet reflections that rebound vertically from a point lower on the pocket wall, with the result that they combine with the reflection at P6 to falsely give the impression of a properly formed lead. This could lead to the acceptance of a malformed lead. In either case, if the entire component were to shift slightly to the right (in this view) within the pocket, so that the lead contacted the inside of the pocket, the reflections at P3, P4 and P5 would be crowded even closer together, compounding the problem.

FIG. 4C schematically shows a component C in a standard carrier pocket with slightly sloped sides (only a few degrees from vertical). If an AVI system were inspecting the leads on the right side of this pocket (in this view), it would begin analyzing a digital representation of the pocket at a location depicting the right end of the pocket and scan toward the left, as if panning across the actual pocket in the direction indicated by the arrow in the figure. As with the earlier examples, the directly vertical reflection at the pocket edge (P1) would be first encountered. The next would be the sideways reflection off the end of the lead that rebounds off the end wall to the AVI system (P5). Ignoring a probable reflection at the location at which the pocket "bottoms out," the next is the vertical reflection directly off the horizontal segment just inboard of the end of the lead (P3). The reflections at P1, P5 and P3 are generally close enough to one another to be incorrectly interpreted by an AVI system as indicating an out-of-spec elongation of the lead. Therefore, the AVI system might again reject a component that is not defective. As with the previous example, discussed in connection with FIG. 4B, if the component were to shift to the right, the reflections at P3 and P5 would be moved even closer to one another.

Because an AVI system will also usually need to detect and interpret an ink or etched symbol and/or an off-center notch (to establish the type and orientation of the component) on the component body in order to properly interpret the reflection pattern in the inspection zone, the extraneous reflection problem cannot be acceptably addressed simply by reducing the intensity of the light.

Further, due to dimension tolerances in the manufacture of carrier tape or trays, as well as in the indexing machines that transport the tape or trays through the inspection systems, a certain amount of drift in the actual versus expected location of the leads will sometimes occur. Thus, it is preferred that the inspection region be as large as possible to account for such drift.

Examples of known carrier tape designs are shown in U.S. Pat. No. 4,966,281, to Kawanishi et al., which relates to an electronic component carrier tape with a number of cavities or pockets. FIGS. 4A–11C of this patent illustrate several carrier pocket configurations. For example, FIGS. 4A, 4B and 8A–11C show various rectilinear pockets, while FIGS. 5 and 6A–7B show curved pocket structures. However, none of these designs sufficiently addresses the above-discussed reflection problems. For example, it is apparent from inspection that the pocket shown in FIG. 5 of Kawanishi et al. has the edge of the pocket floor near the lead tips. Thus, this design likely suffers from at least the bottom-edge reflection problem discussed above in correction with FIG. 4A herein, as will be discussed more fully below.

Further examples of known carrier tape designs are shown in Japanese Utility Model Disclosure No. 4-80890, by Fugiwara. Each of the figures in this utility model shows a cross-section of an arcuate pocket structure. By inspection, it is apparent that each of the designs shown is sloped severely enough in the vicinity of the lead tips that it likely suffers from at least the "doublet" reflection problem discussed above in connection with FIG. 4B herein, as will be discussed more fully below.

Thus, there is a need in the art for a component carrier pocket designed to reduce or eliminate extraneous reflections in the inspection region of an automated visual inspection system.

There is a further need for a component carrier pocket designed to separate component lead direct vertical reflections from the rebound vertical reflections off the pocket walls.

There is also a need for a component carrier pocket designed to reduce or eliminate detectable (in most cases, substantially vertical) reflections within the inspection region directly off the pocket walls.

There is a still further need for a component carrier pocket designed to place as much distance as is reasonably possible between the extraneous reflections and the direct vertical reflections off the actual lead ends.

SUMMARY OF THE INVENTION

The component carrier of the present invention addresses the foregoing needs in the art by providing an anti-reflective pocket.

Accordingly, one aspect of the present invention relates to a component carrier for holding for purposes of visual inspection an electrical component having a lead with a free end, including a carrier substrate and a pocket recessed in the substrate for holding the component in the interior of the pocket. The pocket has at least one local longitudinal axis, which is parallel to the lead of a correctly constructed component of the type the pocket is designed to hold, when the component is properly positioned in the pocket. (Normally, the component is properly positioned if it is centered in the pocket.) As will be appreciated from the foregoing discussion, this longitudinal axis is also parallel to the direction of incrementation of an AVI system as it pans from the edge of the pocket toward the body of the component.

The pocket includes a wall, depending from the carrier substrate and defining a lateral boundary of the pocket, and a bottom. The wall slopes down and inwardly, at a first angle relative to the carrier substrate, through a lead-tip horizontal plane, which is an imaginary horizontal plane that intersects the upper edge of the free end of the lead when the intended component, properly constructed, is correctly oriented in the pocket. The wall slopes down and inwardly, at a second angle relative to the carrier substrate, through a lead-tip vertical plane, which is an imaginary plane that intersects the free end of the lead and is perpendicular to the longitudinal axis of the pocket that is parallel to that lead. The first angle is greater than or equal to approximately 75° and less than or equal to 90°, and the second angle is less than 90° and not greater than the first angle.

In another aspect, the present invention relates to a component carrier, for holding for purposes of visual inspection an electrical component having a lead with a free end, including a carrier substrate and a pocket recessed in the substrate for holding the component in the interior of the pocket. The pocket includes a wall and a bottom. The wall is sloped relative to the carrier substrate such that a midwall-rebound-reflection plane and the lead-tip vertical plane are sufficiently spaced longitudinally to be distinguishable by automated visual inspection. The midwall-rebound-reflection plane is an imaginary plane that intersects the reflection of the front edge of the lead that rebounds off the end wall, up to the inspection vantage point, and which is parallel to the lead-tip vertical plane.

In another aspect, the present invention relates to a component package including a carrier substrate and a pocket recessed in the substrate. The pocket includes a wall, depending from the substrate and defining a lateral boundary of the pocket, and a bottom. An electrical component, with a lead with a free end, is disposed in the interior of the pocket for automated visual inspection. A substantially transparent carrier cover can be secured to the carrier substrate to enclose the component within the pocket. There is a lead-tip horizontal plane and a lead-tip vertical plane when the component is properly oriented in the pocket, with the lead-tip vertical plane being perpendicular to a longitudinal axis of the pocket. The wall slopes down and inwardly at a first angle relative to the substrate through the lead-tip horizontal plane and at a second angle relative to the substrate through the lead-tip vertical plane. The first angle is greater than or equal to approximately 75° and less than or equal to 90°, and the second angle is less than 90° and not greater than the first angle.

In yet another aspect, the present invention relates to a component package including a carrier substrate with a pocket recessed therein. The pocket includes a wall and a bottom. An electrical component, with a lead with a free end, is disposed in the interior of the pocket for automated visual inspection. A substantially transparent carrier cover can be secured to the carrier substrate, enclosing the component within the pocket. There is a lead-tip vertical plane that is perpendicular to a longitudinal axis of the pocket when the component is properly positioned in the pocket, and there is a midwall-rebound-reflection plane that is parallel to the lead-tip vertical plane. The wall is sloped relative to the carrier substrate such that the midwall-rebound-reflection plane and the lead-tip vertical plane are sufficiently spaced apart that the two reflections are distinguishable by automated visual inspection.

In a further aspect, the present invention relates to a process of packaging a plurality of identical electrical components, each having a lead with a free end, including providing a carrier that includes a substrate with a series of identically shaped pockets recessed therein for holding one of the components in the interior of each pocket. The pocket includes (a) a wall depending from the carrier substrate and defining a lateral boundary of the pocket, and (b) a bottom. One of the components is placed in each of the pockets so that there is a lead-tip horizontal plane, and so that there is a lead-tip vertical plane perpendicular to a longitudinal axis of the pocket. The wall of the pocket slopes down and inwardly at a first angle relative to the substrate through the lead-tip horizontal plane and at a second angle relative to the substrate through the lead-tip vertical plane. The first angle is greater than or equal to approximately 75° and less than or equal to 90°, and the second angle is less than 90° and not greater than the first angle. A substantially transparent carrier cover can be affixed to the carrier substrate, so as to cover all of the pockets and enclose the components therein.

In a still further aspect, the present invention relates to a process of packaging a plurality of identical electrical components, each having a lead with a free end. A carrier is provided and includes a substrate with a series of identically shaped pockets recessed therein for holding one of the components in the interior of each pocket. Each pocket includes a wall and a bottom. One of the components is placed in each pocket so that there is a lead-tip vertical plane that is perpendicular to a longitudinal axis of the pocket, and so that there is a midwall-rebound-reflection plane that is parallel to the lead-tip vertical plane. The wall of the pocket is sloped relative to the carrier substrate such that the midwall-rebound-reflection plane and the lead-tip vertical plane are sufficiently spaced apart that the two reflections are distinguishable by automated visual inspection. A substantially transparent carrier cover can be affixed to the carrier substrate, so as to cover the pockets and enclose the components therein.

The objects, features and advantages of the present invention will be better understood with reference to the following drawings, in which like or corresponding reference numbers refer to like or corresponding elements throughout the views.

DETAILED DESCRIPTION OF THE PREFERRED EMBODIMENTS

Figure 1A:
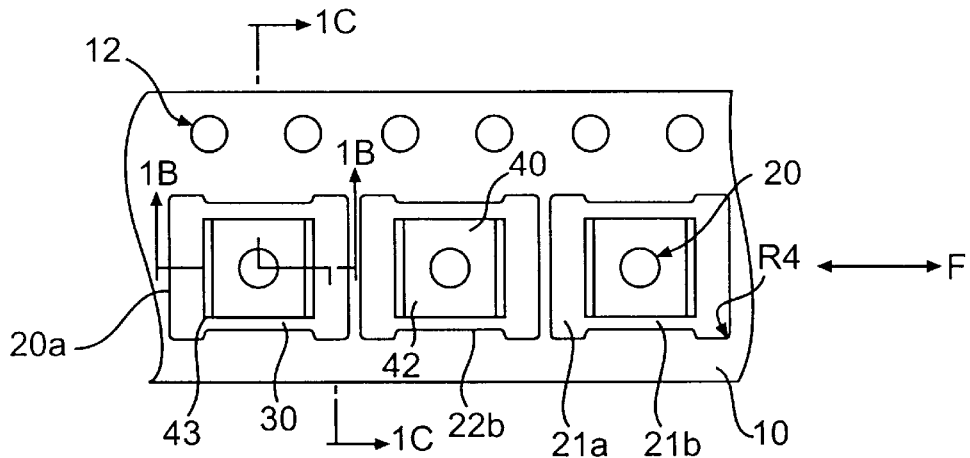
FIG. 1A is a top plan view of a carrier tape of an embodiment of the present invention.

FIGS. 1A–1D show an embodiment of the carrier pocket of the present invention in the context of a carrier tape, but the following discussion will apply equally to carrier trays as well. These figures show a tape substrate 10 which includes a pocket 20 formed therein. The lateral boundaries of the pocket are defined by end and side pocket walls 22a, 22d, respectively. Extending up from a floor 30 of the pocket 20 is a pedestal 40 for supporting components (shown schematically at C in FIG. 1D) above the floor of the pocket. To each end and side of the pedestal is a trough 21a, 21b, respectively, defined by one of the pocket walls 22a, 22d to the outside, the pedestal 24 to the inside, and the pocket floor 30 at the bottom. A cover 50 seals the pocket.

For the sake of clarity and convenience, terms such as "top", "bottom ", "upper", "lower", "horizontal" and "vertical" will be used in the context of the pocket 20, in which the floor 30 is considered to be at the bottom and the carrier cover is considered to be horizontal. "Longitudinal" will be used locally to refer to a direction parallel to the lead of a properly constructed and oriented component in the pocket, when viewed from above. In the embodiment of FIGS. 1A–1D, designed for a component with leads at two opposing sides, the longitudinal direction is indicated by arrow F in FIG. 1A. If a rectangular component has leads extending from two adjacent sides, then it has two local longitudinal axes, which are perpendicular to each other and at cross the center of the body of the component.

The tape substrate 10 is generally a formable, flexible material which possesses sufficient material strength to serve its intended purpose. Preferably, substrate 10 is formed of a thermoformable thermoplastic, such as polystyrene, polyvinyl chloride, polyethylene terephthalate, polycarbonate, or a laminate structure including one or more of the above. In some applications, it is preferable to provide a material with static dissipative or electrically conductive properties, in order to electrostatically protect the component. In the most preferred embodiment, the substrate 10 is formed of a conductive polystyrene, which is relatively inexpensive and possesses satisfactory material properties for this application. The pockets 20 can be formed in the substrate by, for example, thermoforming, pressing, hot-stamping or punching.

The component C to be carried dictates the general size and shape of the pocket 20. The mouth, or opening, of the pocket may be square, rectangular, rounded, or any of an infinite variety of dimensions and shapes. If the pocket mouth 20 is circular, oval or any other rounded shape, the pocket wall can essentially be singular and continuous.

The size and depth of pocket 20, in turn, dictate the thickness of the substrate 10. If the tape is to be thermoformed, the substrate must be thick enough to permit the pocket to be formed without rupture, particulary at the corners. The pocket can be thermoformed, for example, by applying well known techniques essentially to stretch the material from a flat substrate. On the other hand, the substrate should be as thin as possible to minimize the weight and bulk of the carrier, which directly impact shipping and storage costs. However, the substrate 10 cannot be so thin as to completely compromise its strength. Each of these considerations is material-dependent. With conductive polystyrene, substrate thicknesses are generally approximately 0.2 millimeter or greater.

A series of sprocket holes 12 is disposed along the edge of the tape. These are provided so that automated machinery can feed the tape to inspect components, as well as load and unload them from the pockets. The holes 12 are spaced approximately 4 millimeters apart, which is an industry standard. However, this distance can be varied, if desired.

The pedestal 40 in this embodiment has a rectangular upper surface 42 to support a component. The shape of the upper surface 42 is driven by the shape of the component. A pair of fences 43, one at either end of the pedestal, define the longitudinal boundaries within which the component C sits. The fences 43 maintain the component in a consistent longitudinal location, impeding the component from sliding off center on the pedestal 40 to a position in which the leads T contact the pocket end wall 22a.

Figure 1B:
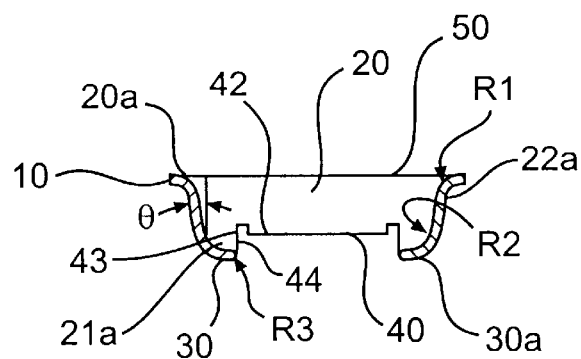
FIG. 1B is a cross section taken along the line 1B—1B in FIG. 1A.
Figure 1C:
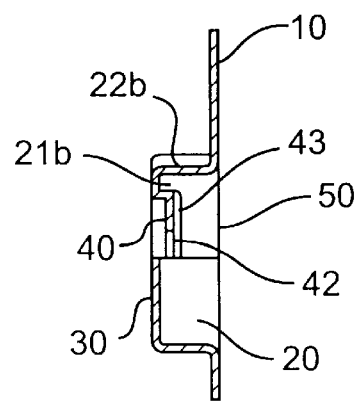
FIG. 1C is a cross section taken along the line 1C—1C in FIG. 1A.

Support walls 44 extend from the pocket floor 30 and terminate at the tops 43a of the fences 43. FIG. 1B, a cross-sectional side view taken along the line 1B—1B in FIG. 1A, shows this best. The support walls can be sloped or arched, or both.

Here, the support walls 44 are substantially flat and vertical, each forming an angle of approximately 90° with the pocket floor 30. While this angle can vary, it is preferred to have a near-vertical support wall 44 to keep the intersections between the floor 30 and the support walls 44 out of the inspection region, as discussed more fully below. Due to the realities of thermoforming, some draft angle will remain and a small radius of curvature will probably exist at the junction between the support wall 44 and the pocket floor 30.

Figure 1D:
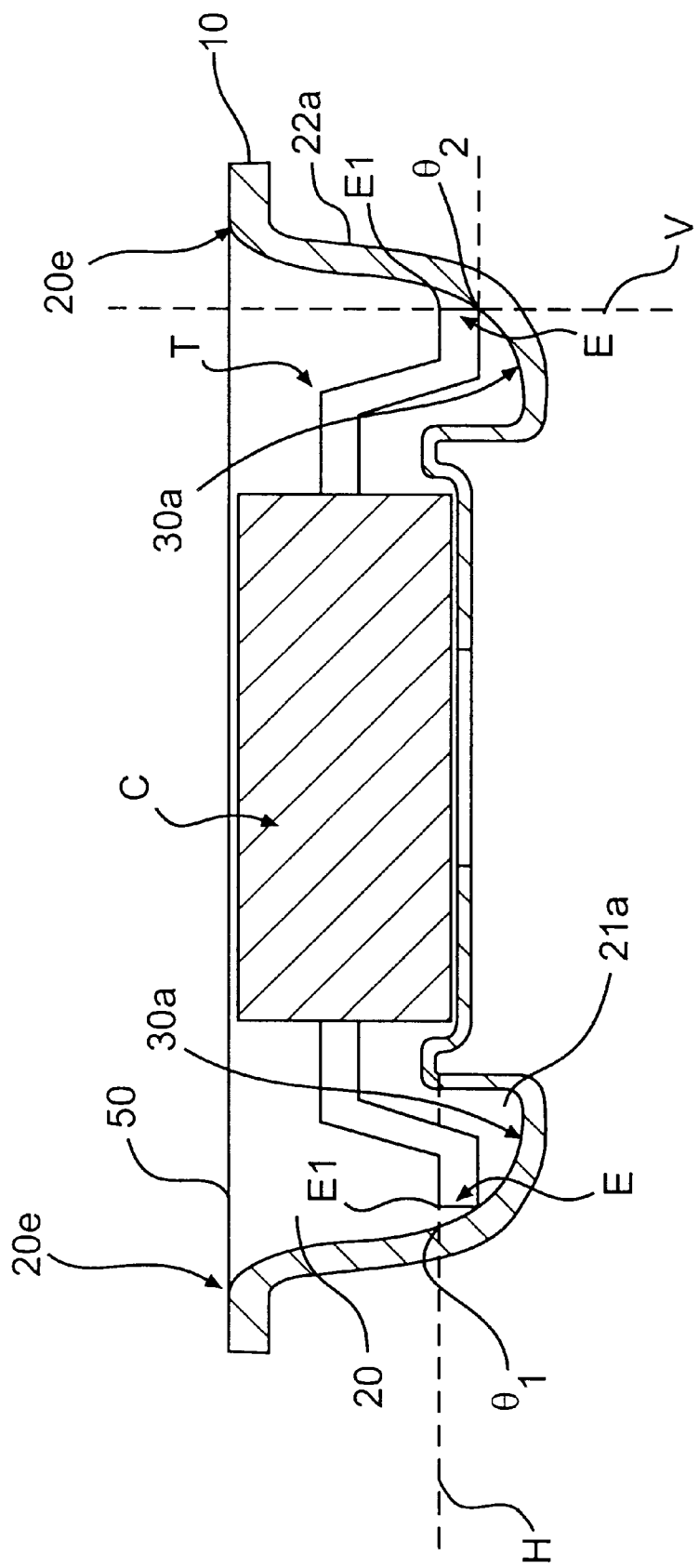
FIG. 1D is a schematic cross section of a component in the carrier tape of FIG. 1B.

As seen in FIG. 1D, the leads T of a component C in the pocket are disposed in the trough 21a at either end of the pocket. This embodiment has a trough at each end because the component for which this pocket 20 is designed has leads extending from its two ends. A narrower side trough 21b extends along each side of the pedestal. These side troughs 21b are not designed to house component leads, but are provided for material considerations. As discussed later, the troughs 21a are elongated, creating lateral bulges in the side walls 22d of the pocket, and therefore require the material at the corners of the pocket 20 to be stretched further during formation. By not extending the pedestal 40 entirely to the side walls 22d of the pocket, more material is available to form the elongated troughs 21a.

The pocket would be configured differently for a different component. For example, the side troughs 21b can be omitted. A solitary trough can be provided at one end for a component with leads at only one end. Wider troughs can be provided on all sides of the pedestal 40 for a component with leads on all sides, or a single, continuous trough can surround the pedestal.

It should be noted that additional fences can also be provided on the sides of the pedestal 40, especially in a pocket designed for rectangular components with leads extending from all four sides. It is generally desired to maintain the transverse position of the component within the pocket 20. In the illustrated embodiment, although the pedestal 40 does not extend completely to the sides of the pocket 20, the pocket 20 is sized so that the component fits snugly between the side walls 22b.

As discussed, it is preferred that the sideways reflections of the leads T that rebound vertically off the end walls 22a to the AVI system be separated from the vertical reflections directly off the leads themselves. It is therefore preferred, but not necessary, that the component leads T not touch the pocket end walls 22a, so as to maintain separation of those reflections. In this embodiment, the pedestal 40 and fences 43 maintain the component C in position away from the bottom of the pocket, and the end walls 22a are configured to avoid contact with the leads T.

In order to facilitate description, we will refer to the three imaginary planes mentioned earlier. The lead-tip vertical plane (indicated by the dashed line V in FIG. 1D) is a plane that intersects the free end E of the lead T (of a component for which the pocket is designed, which is properly constructed, and which is properly oriented within the pocket), and which is perpendicular to the longitudinal axis of the pocket that pertains to that particular lead (which we sometimes refer to herein as the "local longitudinal axis", since the pocket will have two longitudinal axes, in a cross-hair relationship, if there are leads extending from adjacent sides of a component body that has a rectangular shape, when viewed from above). The midwall-rebound-reflection plane is a plane that is perpendicular to the local longitudinal axis and intersects the reflection of the front edge of the (properly constructed and oriented) lead that rebounds up to the AVI lens from the end wall 22a (shown more clearly with reference to FIG. 3, discussed below). The lead-tip horizontal plane (indicated by the dashed line H in FIG. 1D) is a horizontal plane that intersects the upper edge E1 of the free end E of a (properly constructed and oriented) lead T. It should be noted that the locations of these planes can vary slightly from component to component due to manufacturing tolerances. To the extent possible, the pocket should be designed and constructed to account for these variations in component dimensions.

The distance between the midwall-rebound-reflection plane and the lead-tip vertical plane will dictate how close the reflections of the leads that first rebound off the end walls appear to the AVI system to be to the reflections directly off the ends of the lead. Therefore, in the preferred embodiment, the end walls 22a are configured so that the midwall-rebound-reflection plane will be separated from the lead-tip vertical plane by a longitudinal distance greater than the minimum represented actual distance scanned in the longitudinal direction by the AVI system in confirming the presence of a lead. That is, if a system serially scans the digital representation of the pocket at predetermined increments representing set longitudinal distances, and is programmed to interpret a predetermined number of consecutive "bright" readings to be a lead, then the minimum distance scanned by the AVI system in confirming the presence of a lead will be the product of the predetermined incremental represented distance times the predetermined number of bright readings. With this design criterion set, the actual shape of the end walls 22a can be determined according to an iterative process, as described more fully below.

In addition to separating the detectable reflections of the leads T that rebound off the sidewalls from the detectable reflections directly off the leads themselves, it is also preferred to eliminate or isolate the detectable reflections created by the carrier itself. These reflections generally occur at sharp corners or at transitions to surfaces that are nearly perpendicular to the light projected by the AVI system.

In the embodiment shown in FIGS. 1A–1D, the transitions between the pocket end wall 22a and the substrate 10 are preferably smooth so as to avoid the creation of any discontinuities (i.e., severe angles) in the inspection region. Near the substrate 10 in the preferred embodiment, the pocket end wall 22a is curved so as to be convex relative to the center of the pocket 20. This not only smooths the transition, but also moves the horizontal surface at the edge 20a of the pocket 20, and the direct vertical reflection created thereby, away from the ends E of the component leads T. The farther away from the lead ends E the edge of the pocket is, the larger the inspection region can be without encompassing the reflection created at the edge 20a. It is preferred that this transition be a curvature having a radius of at least twice the material thickness.

It would be ideal to be able to curve the side wall so that it reaches the substrate at the beginning of the next pocket, effectively creating a linear transition between pockets. This would maximize the distance between the pocket edge 20a and the lead ends E. However, as a practical matter, some flat substrate 10 should be retained between at least some adjacent pockets to provide a surface to which the cover 50 can be adhered.

Similarly to the pocket edge 20a, it is preferred that the transition between the end wall 22a and the floor 30 be smooth. Nearer to the floor 30, the pocket wall 22a is preferably curved to be concave relative to the center of the pocket 20. Again, this acts to smooth the transition and to move the edge 30a of the horizontal floor, and the detectable reflection created thereby, away from the ends E of the component leads T. This also permits the inspection region to be larger.

It is most preferred that the pocket end wall 22a continue to curve down-and-inwardly until it joins directly with the support wall 44 of the pedestal, essentially eliminating the existence of any horizontal surface in the trough 21a. However, this is not necessary, and spacial considerations often dictate otherwise. With carrier tape, for example, the number of components that can be spooled in a given limited space is directly dependent upon the depth of the individual carrier pockets. Therefore, by permitting the trough 21a to have a discernable horizontal floor 30 near the pedestal, the pocket depth can be reduced, and a greater spooling capacity can be achieved.

Although it is not necessary to eliminate a horizontal surface altogether from the trough 21, it is preferred that the edge 30a of the floor 30 be closer to the center of the pocket than is the lead-tip plane, by a longitudinal distance greater than the minimum longitudinal distance scanned by the AVI system in confirming the presence of a lead. As discussed earlier with respect to the positioning of the reflections cast by the leads T off the end walls 22a, this distance is the product of the predetermined incremental distance between scans times the predetermined number of bright readings.

Once the desired locations of the pocket edge 20a and the floor edge 30a have been determined, then the shape of the pocket end wall 22a can be chosen, generally by trial-and-error and inspection, to keep the wall far enough from the center of the pocket to avoid contact with the component leads T and maintain the above-discussed separation between the detectable reflections directly off the component leads and the detectable reflections cast thereby off the end walls, while avoiding sharp curves. The transition between the inward and outward curvatures of the end wall 22a is preferably smooth, to avoid discontinuities in the inspection region.

Figure 4A:
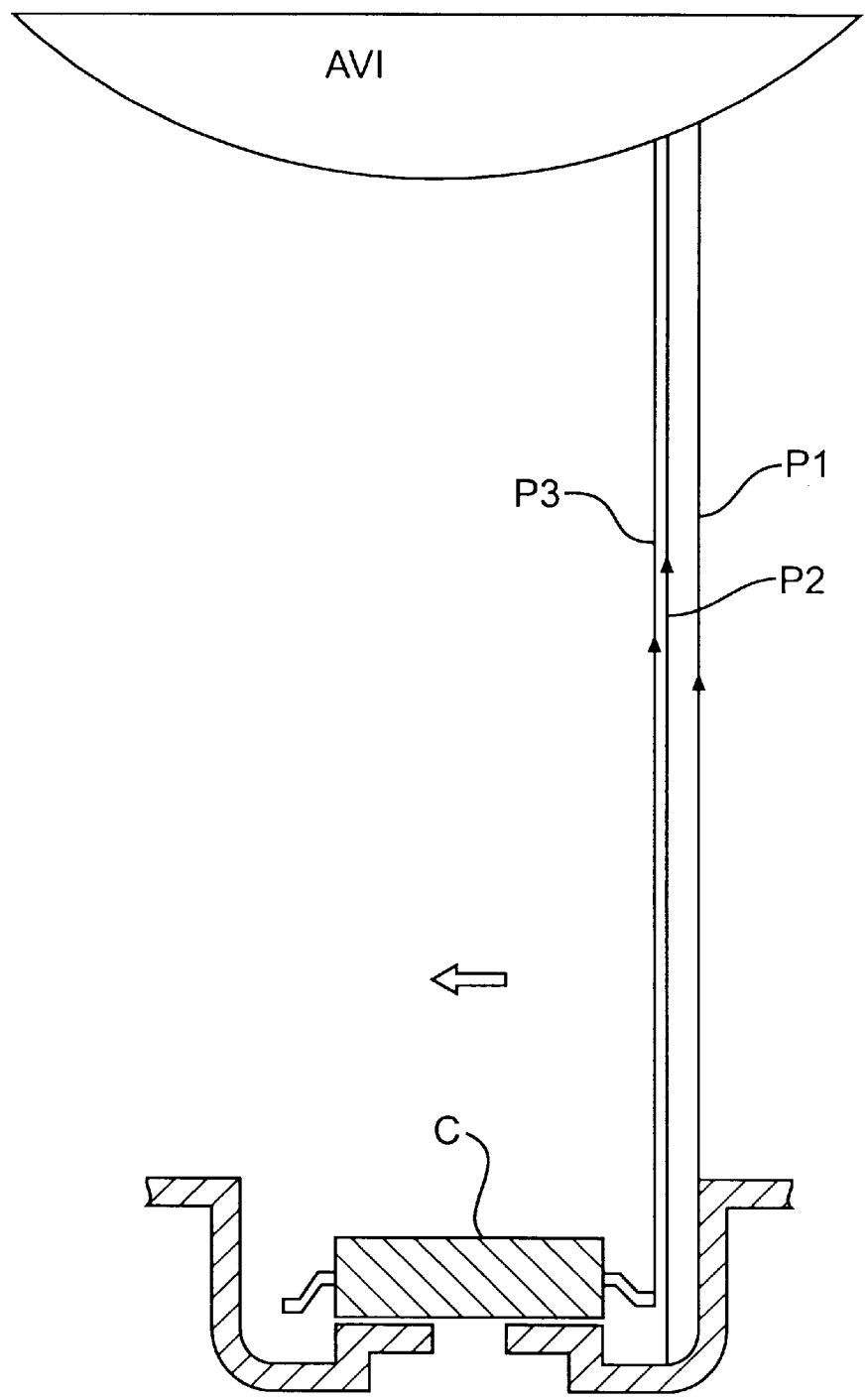
FIG. 4A is a schematic cross section illustrating a typical reflection pattern detected by an AVI system inspecting a component in a conventional (prior art) carrier pocket.
Figure 4B:
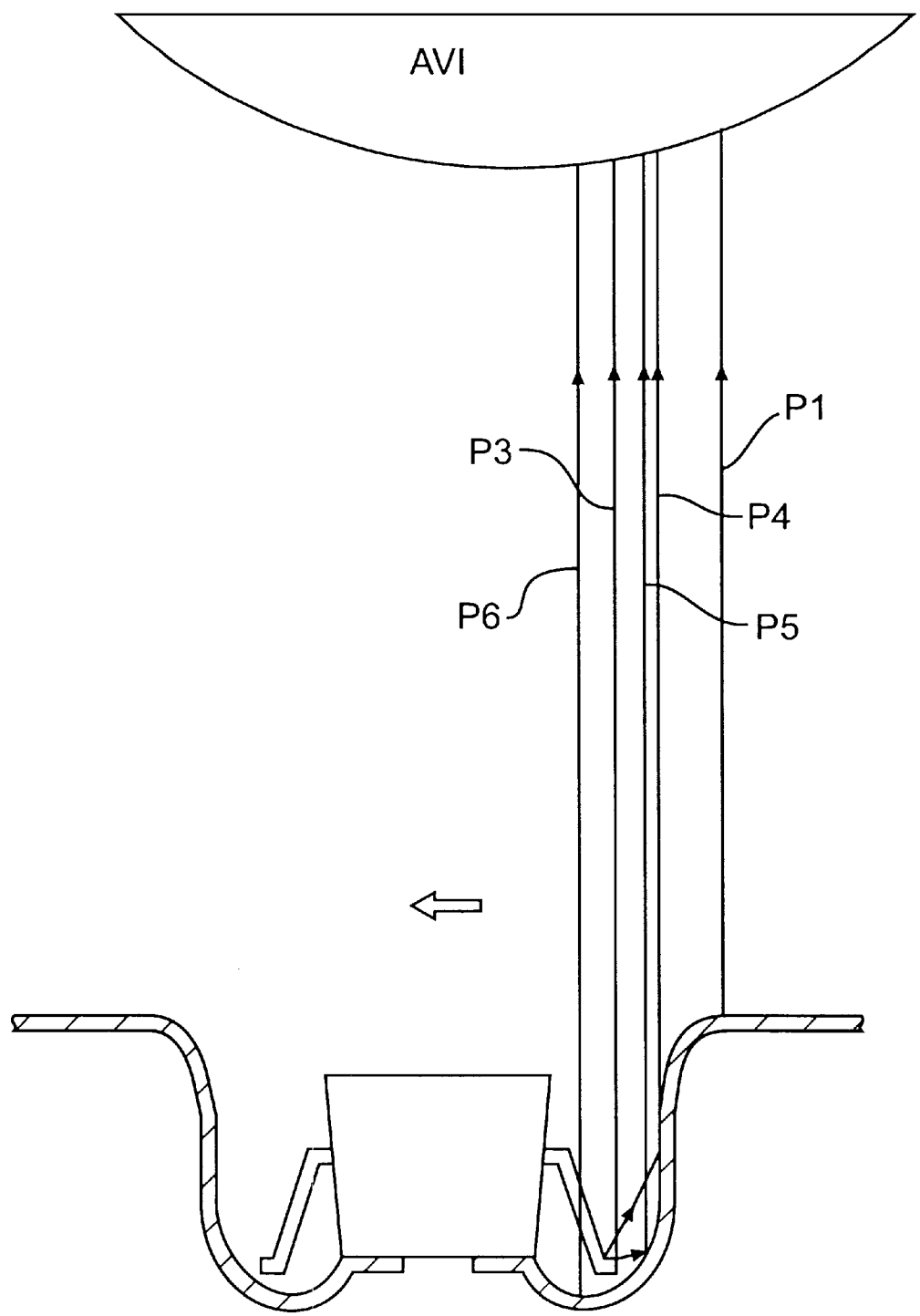
FIG. 4B is a schematic cross section illustrating a typical reflection pattern detected by an AVI system inspecting another component in another conventional (prior art) carrier pocket.
Figure 4C:
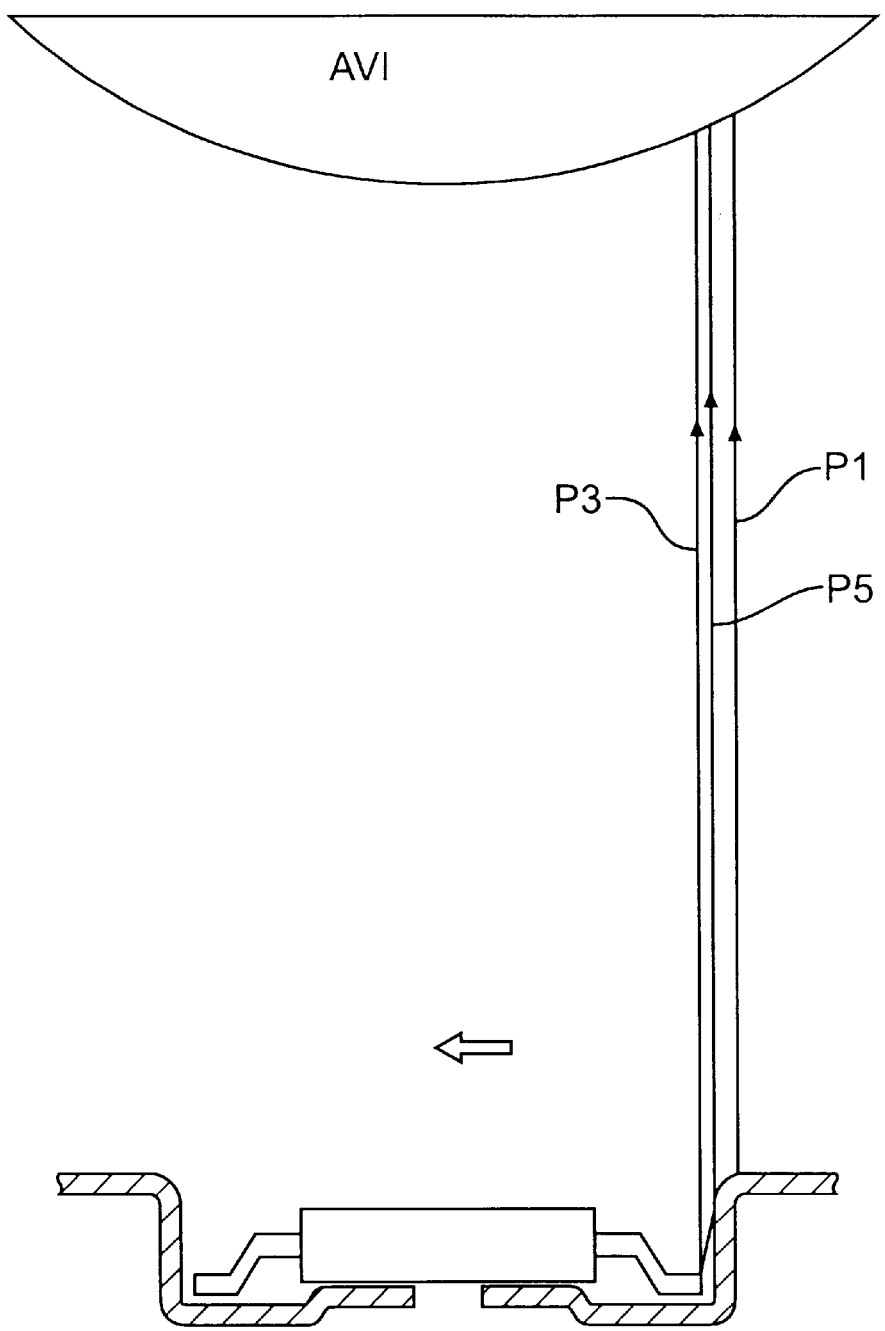
FIG. 4C is a schematic cross section illustrating a typical reflection pattern detected by an AVI system inspecting another component in another conventional (prior art) carrier pocket.

With an exactly vertical end wall 22a, given typical pocket depths, the lead ends E will not cast a detectable reflection off the end wall. However, in order to facilitate mold release during pocket formation, the end wall 22a will generally have a draft angle of at least a few degrees relative to vertical. The closer the end wall 22a is to vertical in the region adjacent and above its intersection with the lead-tip horizontal plane, the closer longitudinally the vertical reflections of the lead ends off the end wall 22a will be to the reflections directly off the actual leads (i.e., the closer the midwall-rebound-reflection plane will be to the lead-tip vertical plane). With an end wall 22a that is more severely sloped away from the center of the pocket 20, the reflections will fall lower on the end walls 22a, but the increased angle will increase the longitudinal separation of the rebound reflections from the direct reflections off the lead ends E. However, if the end wall is sloped too severely through its intersection with the midwall-rebound-reflection plane, a second set of reflections is often created (pairing with the first set to create closely-spaced "doublet" reflections, as discussed above in connection with FIG. 4B), undermining the effect.

For a pocket with an end wall 22a that slopes up and out from the pocket floor, the midwall-rebound-reflection plane will intersect the end wall 22a higher than does the lead-tip horizontal plane. Thus, for each component and pocket, the slope of the pocket end wall 22a at each point in the region at and immediately above the lead-tip horizontal plane can be optimized. It is important to realize that as the slope of the end wall is altered, the horizontal curve of intersection of the end wall with the midwall-rebound-reflection plane will move up and down the end wall. This curve of intersection will in many cases be a substantially straight line across most of the expanse of the end wall. However, if the end wall bulges or is corrugated in some manner (when viewed from above) across its transverse span from side wall to side wall, then the curve of intersection will not be a straight line.

Through an iterative process, the slope (or slopes, for a curved or multifaceted—discussed below—end wall) can be found at which only a single set of reflections of the lead ends is created in the end wall, and that set of reflection is sufficiently separated longitudinally from the lead ends. We have found that this is best achieved with an end wall 22a which is sloped at and immediately above its curve of intersection with the lead-tip horizontal plane at an angle $\theta_1$ within an approximate range of 75° to slightly less than 90°, relative to the carrier substrate. Preferably, this slope is at least about 79°, relative to the carrier substrate.

In the preferred embodiment, the pocket is wider—i.e., extends farther in the transverse direction—at the trough 21a than over the pedestal 40, thus creating bulges 22c in the side walls 22d. It is also preferred that the side walls 22d at the bulges 22c be substantially vertical. The width of the pocket at the pedestal defines the boundaries within which the component can move transversely within the pocket. Preferably, the pocket at the pedestal is only slightly wider than the body of the component itself, so that the component fits snugly within the pocket and cannot move much from side-to-side. Thus, the location of the leads T can be controlled within well-defined lateral boundaries. Providing a wider trough 21a with vertical lateral walls helps to ensure that any substantially vertical reflections which might be created at the side wall 22d at the end of the trough will be outside of these lateral boundaries within which the leads T will remain.

In the embodiment shown in FIGS. 1A–1D, and by way of example, the carrier tape is designed for a standard SOIC08 JEDEC component, and for use with an AVI system that dictates that the midwall-rebound-reflection plane preferably be separated from the lead-tip vertical plane by a horizontal distance of at least approximately 0.2 millimeter. The tape substrate 10 is approximately 0.3 millimeter thick, and the tape is approximately 12 millimeters across. The pockets are approximately 7.4 millimeters from end-to-end, and 2.12 millimeters deep. At a height of approximately 0.3 millimeter from the bottom of the pocket, the pocket is approximately 6.23 millimeters from end-to-end. The pitch, or distance from the center of one pocket to the center of the next, is approximately 8 millimeters.

The pedestal 40 is approximately 0.82 millimeter tall at the fence, and approximately 0.57 millimeter tall every-where else. The pedestal is approximately 4.0 millimeters wide, and 4.6 millimeters from end-to-end, with the fences 43 taking up approximately 0.35 millimeter of that length at each end.

The outer radius of curvature R1 at the top of the wall is approximately 0.8 millimeter. The inner radius of curvature R2 at the bottom of the wall is approximately 0.8 millimeter. This is compared to the outer radius of curvature R3 of approximately 0.3 millimeter at the junction between the floor 30 and the support wall 44 of the pedestal 40. About halfway up the wall, at approximately the wall's substantially linear intersection with the midwall-rebound-reflection plane, the wall is disposed at an angle $\theta$ of approximately 8° relative to vertical.

Near its middle, at the pedestal, the pocket is approximately 5.4 millimeters across. At either of the end troughs 21a, the pocket is approximately 5.94 millimeters across at a height of approximately 0.3 millimeter from the floor. The inner radius of curvature R4 is approximately 0.4 millimeter at each corner of the trough 21a. Of course, other dimensions and angular relationships can be used as desired.

By way of example, in designing this pocket, the end wall angle $\theta$ was initially set at 12° relative to vertical, rather than 8°. This resulted in a pocket end-to-end length of 7.6 millimeters, rather than 7.4 millimeters, which beneficially increased the distance between the lead-tip vertical plane and both the midwall-rebound-reflection plane and the pocket edge. However, in use, this configuration resulted in doublet lead reflections in the pocket end walls 22a, so the angle $\theta$ was reduced.

Figure 2:
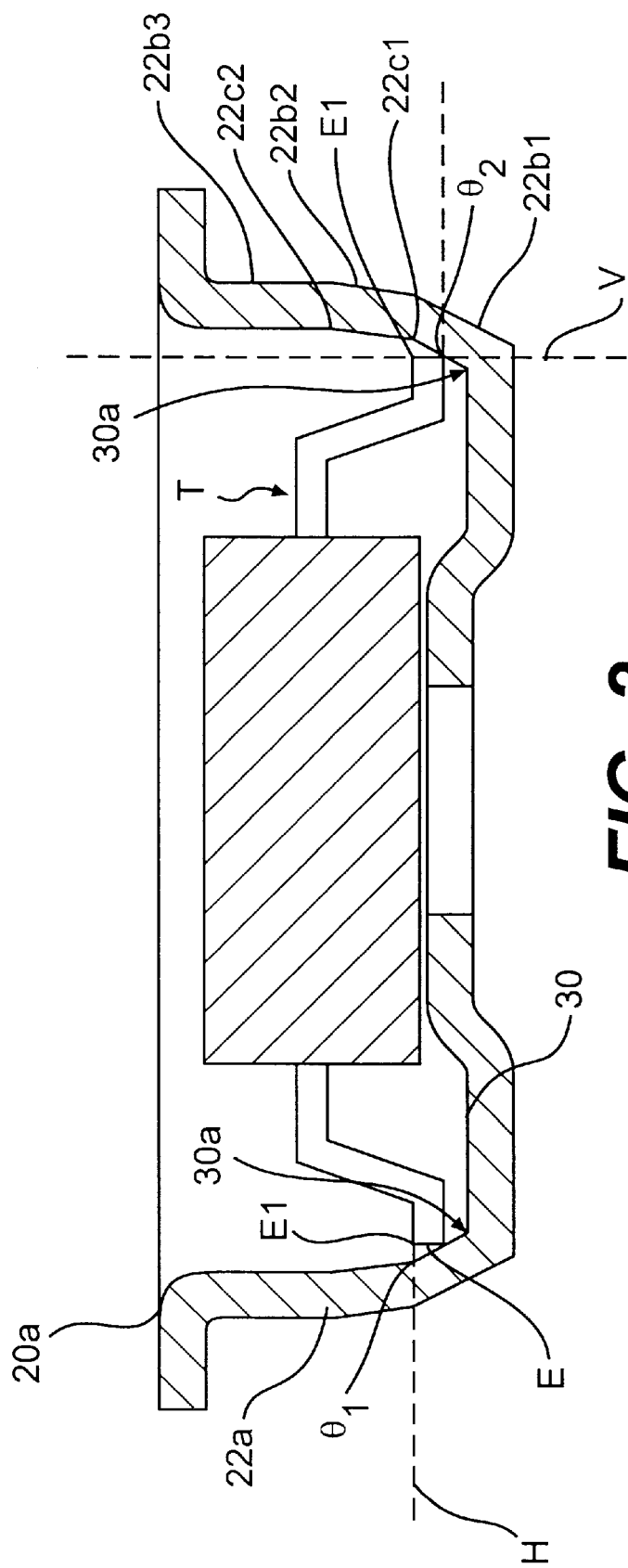
FIG. 2 is a schematic cross section of a component in a carrier tape of another embodiment of the present invention.

In an alternative embodiment, as shown in FIG. 2, the pocket end wall 22a can be chamfered rather than arcuate in shape. In this embodiment, the wall 22a is made up of substantially linear segments 22b1, 22b2, 22b3, which are defined by subtle internal transition angles 22c1, 22c2. As with the embodiment discussed in connection with FIGS. 1A–1D, it is preferred to keep the floor edge 30a spaced inwardly of the lead-tip vertical plane as much as possible. Preferably, the floor edge will be closer to the center of the pocket than is the lead-tip vertical plane by more than the above-described minimum longitudinal AVI scan distance. Again, however, this is not always practical, due to the above-discussed spacial considerations. For example, in the embodiment of FIG. 2, the floor edge 30a is set closer to the lead-tip vertical plane than would be ideal, in order to reduce the overall pocket depth.

It is also preferred that the component be physically supported primarily at its body, rather than at its lead-tips, by the interior of the pocket. Thus the pocket walls should be designed, if possible, so that the pocket length from end-to-end at the expected height of the lead ends is at least as long as the expected tip-to-tip length of the component.

By increasing the angle at the pocket edge 30a, the lowermost segment 22b1 can be sloped more severely from vertical. This, in turn, promotes a larger separation of the pocket edge 20a from the lead-tip vertical plane. However, as with the embodiment discussed in connection with FIGS. 1A–1D, if the end wall 22a is sloped too severely throughout a region extending too far above its intersection with the lead-tip horizontal plane, troublesome doublet reflections will appear. Therefore, it is preferred that the angles at 20a, 22c1 and 22c2, and the lengths of the segments 22b1, 22b2, etc., be chosen so that the slope of the end wall 22a in the region of its line of intersection with the lead-tip vertical plane be at an angle $\theta_2$ as far from vertical as possible (given spacial limitations), without being horizontal. In reality, if the lead-tip vertical plane intersects the end wall 22a at a transitional angle between segments, the slope of the end wall at that intersection will be indefinite. For the purposes of this invention, the "slope" of the wall at that intersection can be considered to be equal to the slope of the imaginary line that is perpendicular to the imaginary line that bisects the transitional angle between segments. In the region of the curve (in this embodiment, a substantially straight line) of intersection between the end wall and the midwall-rebound-reflection plane, the slope of the end wall should be close enough to vertical to avoid doublet lead-tip reflections off the end wall.

As mentioned earlier, it is not necessary that the leads T be physically separated from the pocket end walls 22a. As shown in the embodiment illustrated in FIG. 2, the pedestal is sufficiently tall and broad to ensure that the component, resting primarily against the pedestal under the force of gravity, remains properly oriented in the pocket (when the longitudinal axis of the pocket is horizontal). However, the pedestal does not have fences to keep the component from sliding longitudinally to a position at which the leads T touch the inside of the pocket. If no pedestal is employed, and in some cases where a pedestal is employed, the free end E of one or both sets of leads will sometimes rest directly against the inside of the pocket 20. However, due to the angled wall 22a (or curved wall, as in the embodiments of FIGS. 1A–1D), the bottom of the free end E of the lead T does not in most cases touch a vertical or near vertical segment of the pocket wall. Therefore, the top edge E1 of each free end E is separated from the pocket wall. Due to the angle, the reflection of light from the leads, against the pocket wall, and up to the AVI system is separated from the reflection directly off the lead itself. In the preferred embodiment, this separation (between the lead-tip vertical plane and the midwall-rebound-reflection plane) is greater than the above-discussed minimum longitudinal distance scanned by the AVI system in confirming the presence of a lead.

As with the embodiment illustrated in FIGS. 1A–1D, a greater separation can be achieved between the lead-tip vertical and midwall-rebound-reflection planes with an end wall 22a that slopes more severely away from vertical. However, as with the previous embodiment, doublet reflections are also a concern. Therefore, the slope of the end wall 22a in the region of its line of intersection with the midwall-rebound-reflection plane should not be severe enough to produce doublet reflections. Here, this is achieved with a multifaceted wall 22a, in which the slope of the lower-most segment 22b1 is more severe than the slope of the segment 22b2 immediately above it. Again, we have found that an end wall 22a with a slope of about 75° to slightly less than 90°, preferably at least 79°, in the region straddling its line of intersection with the lead-tip horizontal plane achieves this best.

Although not shown in this view, the transverse bulges 22c, disposed in the sidewalls 22d of the embodiment discussed above with reference to FIGS. 1A–1D, can be employed in a carrier pocket with no pedestal, or with a pedestal without fences, as in this embodiment. As with the earlier embodiment, these lateral bulges help to ensure that any substantially vertical reflections which might be created in the side walls 22d will be outside the lateral boundaries within which the leads T can be expected to be located.

As another example, the embodiment shown in FIG. 2 is also designed for a standard SOIC08 JEDEC component, and for use with an AVI system that dictates that the midwall-rebound-reflection plane preferably be separated from the lead-tip vertical plane by a horizontal distance of approximately 0.2 millimeter. The tape substrate 10 is approximately 0.3 millimeter thick, and the tape is approximately 12 millimeters across. The pockets are approximately 6.4 millimeters long at a height of 0.3 millimeter above the pocket floor, and approximately 2.1 millimeters deep at their deepest. The pitch, or distance from the center of one pocket to the center of the next, is approximately 8 millimeters.

The pedestal is approximately 0.25 millimeter tall and approximately 5.2 millimeters wide. This is the full width of the pocket at that location (the pocket is slightly wider at its mouth due to the approximately 3° draft angle on the side walls). The pedestal is approximately 3.4 millimeters across its upper surface from end-to-end.

The lowest end wall segment 22b1 is disposed at an angle of approximately 30° relative to vertical. The angle 22c1 is located approximately 0.3 millimeter from the pocket floor, and the intermediate wall segment 22b2 is disposed at an angle of approximately 11° relative to vertical. The angle 22c2 is located approximately 0.95 millimeter above the pocket floor, and the wall segment 22b3 is approximately vertical, with a slight draft angle to permit mold release.

Other dimensions and angular relationships can be used as desired. In this case, for example, the midwall-rebound-reflection plane intersects the intermediate wall segment 22b2, which begins just below the lead-tip horizontal plane. The angle of the lower segment 22b1 was set at 30° relative to vertical, to increase the separation of the midwall-rebound-reflection plane from the lead-tip vertical plane. The angle was reduced at segment 22b2 to 11° relative to vertical, to maintain the separation between the midwall-rebound-reflection plane and the lead-tip vertical plane, while avoiding doublet lead reflections in the pocket end walls 22a.

Figure 3:
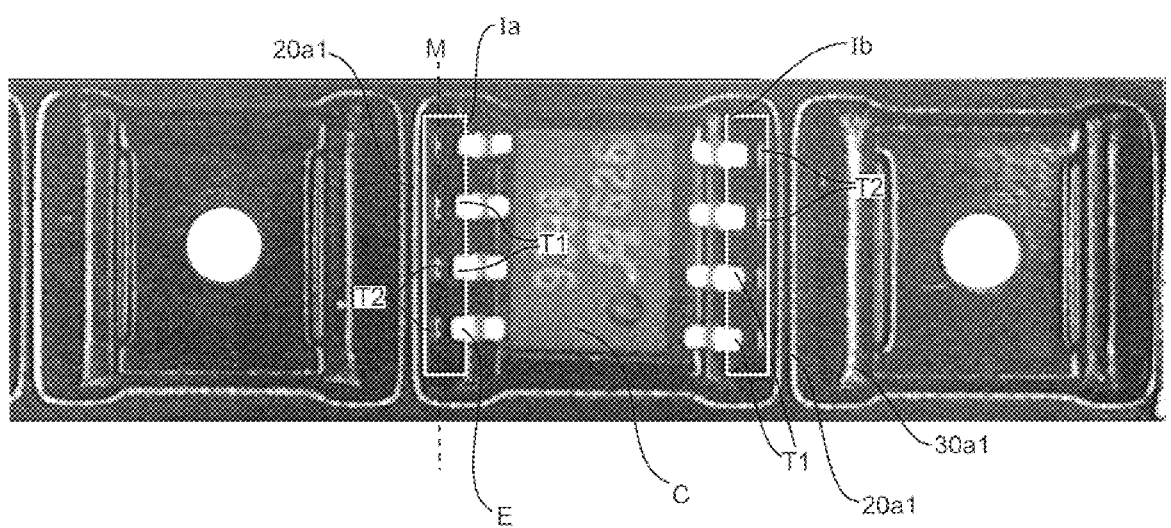
FIG. 3 is a schematic digital gray-scale representation of an actual reflection pattern from a carrier tape constructed according to the present invention, with a component disposed in one pocket.

FIG. 3 is a schematic digital gray-scale representation of a reflection pattern in a carrier pocket of the embodiment of the present invention illustrated in FIGS. 1A–1D, as seen by an AVI system. Sample AVI inspection regions are indicated by the parallel boxes Ia and Ib superimposed over the center pocket, in which a component C is disposed. The substantially vertical reflections directly from the leads T are shown at T1. The substantially vertical reflections at the pocket edges 20a are shown at 20a1. The substantially vertical reflections cast by the leads T off the end wall 22a of the pocket are shown at T2 (defining the midwall-rebound-reflection plane, shown at dashed line M). The substantially vertical reflections from the bottom edges 30a are shown at 30a1. It is readily apparent that all of the extraneous reflections T1, 20a1, and 30a1 are well separated from the ends E of the leads T. Although specific embodiments of the present invention have been described above in detail, it will be understood that this description is merely for purposes of illustration. Various modifications of and equivalent structures corresponding to the disclosed aspects of the preferred embodiments in addition to those described above may be made by those skilled in the art without departing from the spirit of the present invention, which is defined in the following claims.

We claim:

1. A component carrier for holding for purposes of automated visual inspection an electrical component having a lead with a free end, comprising:

a carrier substrate; and a pocket recessed in the substrate for holding the component in the interior of the pocket, the pocket comprising (a) a wall depending from the carrier substrate and defining a lateral boundary of the pocket, and (b) a bottom, wherein there is a lead-tip horizontal plane and a lead-tip vertical plane, both intersecting a tip of the free end of the lead of a correctly constructed component of the type the carrier is intended to hold when the component is properly oriented in the pocket, the lead-tip vertical plane being perpendicular to a longitudinal axis of the pocket, the lead-tip horizontal plane being parallel to a plane approximated by the carrier substrate adjacent to the pocket, and wherein the wall slopes down and inwardly at a first angle, relative to the plane approximated by the carrier substrate, through the lead-tip horizontal plane and at a second angle, also relative to the plane approximated by the carrier substrate, through the lead-tip vertical plane, the first angle being greater than or equal to approximately 75° and less than or equal to 90°, and the second angle being less than 90° and not greater than the first angle.

2. The component carrier of claim 1, wherein the first angle is at least approximately 79°.

3. The component carrier of claim 1, wherein the carrier substrate has a thickness, the wall depends from the carrier substrate so as to form an exterior radius of curvature, and the wall extends from the pocket bottom so as to form an interior radius of curvature, and each of the radii of curvature is at least twice the thickness of the carrier substrate.

4. The component carrier of claim 1, wherein the pocket further comprises outwardly projecting transverse bulges at each longitudinal end of the pocket.

5. The component carrier of claim 1, further comprising a pedestal projecting from the pocket bottom, the pedestal including an upper surface for supporting the component.

6. The component carrier of claim 5, wherein the pocket wall, the pocket bottom and the pedestal combine to define a trough at each longitudinal end of the pocket, the pocket being wider at each of the troughs than at the location of the pedestal.

7. The component carrier of claim 5, wherein the pedestal further includes a protrusion projecting from the upper surface for limiting the movement of the component within the pocket.

8. The component carrier of claim 7, wherein the upper surface of the pedestal extends partially across the pocket in a longitudinal direction, and the protrusion comprises a pair of fences, a different one of the fences being located at each longitudinal end of the pedestal.

9. A component carrier for holding for purposes of automated visual inspection an electrical component having a lead with a free end, comprising:

a carrier substrate; and a pocket recessed in the substrate for holding the component in the interior of the pocket, the pocket comprising a wall and a bottom, wherein there is a lead-tip vertical plane that is perpendicular to a longitudinal axis of the pocket and intersects a tip of the free end of the lead of a correctly constructed component of the type the carrier is intended to hold when the component is properly positioned in the pocket, wherein there is a midwall-rebound-reflection plane that is parallel to the lead-tip vertical plane and intersects a reflection cast upwardly off the wall by the tip of the free end of the lead of the correctly constructed, properly positioned component, and wherein at least a portion of the wall is sloped relative to the carrier substrate such that the midwall-rebound-reflection plane and the lead-tip vertical plane are sufficiently spaced apart to be distinguishable by automated visual inspection.

10. The component carrier of claim 9, wherein the wall and the bottom converge at a floor edge, and the floor edge is spaced longitudinally from the lead-tip vertical plane in an opposite direction from the midwall-rebound-reflection plane so as to be distinguishable by automated visual inspection from the lead-tip vertical plane.

11. The component carrier of claim 9, wherein the automated visual inspection occurs in longitudinal increments, and the midwall-rebound-reflection plane is spaced longitudinally from the lead-tip vertical plane by a distance exceeding a predetermined number of the longitudinal increments.

12. The component carrier of claim 9, wherein the carrier substrate has a thickness, the wall depends from the carrier substrate so as to form an exterior radius of curvature, and the wall extends from the pocket floor so as to form an interior radius of curvature, wherein each of the radii of curvature is at least twice the thickness of the carrier substrate.

13. The component carrier of claim 9, wherein the pocket further comprises outwardly projecting transverse bulges at each longitudinal end of the pocket.

14. The component carrier of claim 9, further comprising a pedestal projecting from the pocket bottom, the pedestal including an upper surface for supporting the component.

15. The component carrier of claim 14, wherein the pocket wall, the pocket bottom and the pedestal combine to define a trough at each longitudinal end of the pocket, the pocket being wider at each of the troughs than at the location of the pedestal.

16. The component carrier of claim 14, wherein the pedestal further includes a protrusion projecting from the upper surface for limiting the movement of the component within the pocket.

17. The component carrier of claim 16, wherein the upper surface of the pedestal extends partially across the pocket in a longitudinal direction, and the protrusion comprises a pair of fences, a different one of the fences being located at each longitudinal end of the pedestal.

18. A component package comprising:

a carrier substrate with a pocket recessed therein, the pocket comprising (a) a wall depending from the carrier substrate and defining a lateral boundary of the pocket, and (b) a bottom; and an electrical component having a lead with a free end, the component being disposed in the interior of the pocket for automated visual inspection, wherein there is a lead-tip horizontal plane and a lead-tip vertical plane that both intersect a tip of the free end of the lead of the component when the component is properly oriented in the pocket, the lead-tip vertical plane being perpendicular to a longitudinal axis of the pocket, the lead-tip horizontal plane being parallel to a plane approximated by the carrier substrate adjacent to the pocket, and wherein the wall slopes down and inwardly at a first angle, relative to the plane approximated by the carrier substrate, through the lead-tip horizontal plane and at a second angle, relative to the plane approximated by the carrier substrate, through the lead-tip vertical plane, the first angle being greater than or equal to approximately 75° and less than or equal to 90°, and the second angle being less than 90° and not greater than the first angle.

19. The component package of claim 18, wherein the first angle is at least approximately 79°.

20. The component package of claim 18, wherein the carrier substrate has a thickness, the wall depends from the carrier substrate so as to form an exterior radius of curvature, and the wall extends from the pocket floor so as to form an interior radius of curvature, wherein each of the radii of curvature is at least twice the thickness of the carrier substrate.

21. The component package of claim 18, further comprising a substantially transparent carrier cover secured to the carrier substrate and enclosing the component within the pocket.

22. The component package of claim 18, wherein the pocket further comprises outwardly projecting transverse bulges at each longitudinal end of the pocket.

23. The component package of claim 18, further comprising a pedestal projecting from the pocket bottom, the pedestal including an upper surface supporting the component.

24. The component package of claim 23, wherein the pocket wall, the pocket bottom and the pedestal combine to define a trough at each longitudinal end of the pocket, the pocket being wider at each of the troughs than at the location of the pedestal.

25. The component package of claim 23, wherein the pedestal further includes a protrusion projecting from the upper surface for limiting the movement of the component within the pocket.

26. The component package of claim 25, wherein the upper surface of the pedestal extends partially across the pocket in a longitudinal direction, and
the protrusion comprises a pair of fences, a different one of the fences being located at each longitudinal end of the pedestal.

27. A component package comprising:
a carrier substrate with a pocket recessed therein, the pocket comprising a wall and a bottom; and
an electrical component having a lead with a free end, the component being disposed in the interior of the pocket for automated visual inspection,
wherein there is a lead-tip vertical plane that intersects a tip of the free end of the lead and is perpendicular to a longitudinal axis of the pocket when the component is properly positioned in the pocket, there is a midwall-rebound-reflection plane that is parallel to the lead-tip vertical plane and intersects a reflection cast upwardly off the wall by the tip of the free end of the lead, and at least a portion of the wall is sloped relative to the carrier substrate such that the midwall-rebound-reflection plane and the lead-tip vertical plane are sufficiently spaced apart to be distinguishable by automated visual inspection.

28. The component package of claim 27, wherein the wall and the bottom converge at a floor edge, and the floor edge is spaced longitudinally from the lead-tip vertical plane in an opposite direction from the midwall-rebound-reflection plane so as to be distinguishable by automated visual inspection from the lead-tip vertical plane.

29. The component package of claim 27, wherein the automated visual inspection occurs in longitudinal increments, and the midwall-rebound-reflection plane is spaced longitudinally from the lead-tip vertical plane by a distance exceeding a predetermined number of the longitudinal increments.

30. The component package of claim 27, wherein the carrier substrate has a thickness, the wall depends from the carrier substrate so as to form an exterior radius of curvature, and the wall extends from the pocket floor so as to form an interior radius of curvature, wherein each of the radii of curvature is at least twice the thickness of the carrier substrate.

31. The component package of claim 27, further comprising a substantially transparent carrier cover secured to the carrier substrate and enclosing the component within the pocket.

32. The component package of claim 27, wherein the pocket further comprises outwardly projecting transverse bulges at each longitudinal end of the pocket.

33. The component package of claim 27, further comprising a pedestal projecting from the pocket bottom, the pedestal including an upper surface supporting the component.

34. The component package of claim 33, wherein the pocket wall, the pocket bottom and the pedestal combine to define a trough at each longitudinal end of the pocket, the pocket being wider at each of the troughs than at the location of the pedestal.

35. The component package of claim 33, wherein the pedestal further includes a protrusion projecting from the upper surface for limiting the movement of the component within the pocket.

36. The component package of claim 35, wherein the upper surface of the pedestal extends partially across the pocket in a longitudinal direction, and
the protrusion comprises a pair of fences, a different one of the fences being located at each longitudinal end of the pedestal.

37. A process of packaging a plurality of identical electrical components, each having a lead with a free end, comprising:
providing a carrier comprised of a substrate with a series of identically shaped pockets recessed therein for holding one of the components in the interior of each pocket, each pocket comprising (a) a wall depending from the carrier substrate and defining a lateral boundary of the pocket, and (b) a bottom;
placing one of the components in each of the pockets so that there is a lead-tip horizontal plane parallel to a plane approximated by the carrier substrate adjacent to the pocket, and so that there is a lead-tip vertical plane perpendicular to a longitudinal axis of the pocket, the lead-tip horizontal plane and the lead-tip vertical plane intersecting a tip of the free end of the lead, wherein the wall of the pocket slopes down and inwardly at a first angle, relative to the plane approximated by the substrate, through the lead-tip horizontal plane and at a second angle, relative to the plane approximated by the substrate, through the lead-tip vertical plane, the first angle being greater than or equal to approximately 75° and less than or equal to 90°, and the second angle being less than 90° and not greater than the first angle; and
affixing a substantially transparent carrier cover to the carrier substrate, so as to cover all of the pockets and enclose the components therein.

38. The process of claim 37, wherein the first angle is at least approximately 79°.

39. The process of claim 37, further comprising the step of, after placing one of the components in each of the pockets, visually inspecting the leads of the components.

40. The process of claim 37, wherein the pocket further comprises outwardly projecting transverse bulges at each longitudinal end of the pocket.

41. The process of claim 37, wherein the pocket further comprises a pedestal projecting from the pocket bottom, the pedestal includes an upper surface, and the component is placed within the pocket so that the upper surface supports the component.

42. The process of claim 41, wherein the upper surface of the pedestal extends partially across the pocket in a longitudinal direction, and the pedestal further includes a pair of fences projecting from the upper surface for limiting the movement of the component within the pocket, a different one of the fences being located at each longitudinal end of the pedestal.

43. The process of claim 41, wherein the pocket wall, the pocket bottom and the pedestal combine to define a trough at each longitudinal end of the pocket, the pocket being wider at each of the troughs than at the location of the pedestal.

44. A process of packaging a plurality of identical electrical components, each having a lead with a free end, comprising:

providing a carrier comprised of a substrate with a series of identically shaped pockets recessed therein for holding one of the components in the interior of each pocket, each pocket comprising a wall and a bottom;

placing one of the components in each pocket so that there is a lead-tip vertical plane that is perpendicular to a longitudinal axis of the pocket and intersects a tip of the free end of the lead, and so that there is a midwall-rebound-reflection plane that is parallel to the lead-tip vertical plane and intersects a reflection cast upwardly off the wall by the tip of the free end of the lead, wherein the wall of the pocket is sloped relative to the carrier substrate such that the midwall-rebound-reflection plane and the lead-tip vertical plane are sufficiently spaced apart to be distinguishable by automated visual inspection; and affixing a substantially transparent carrier cover to the carrier substrate, so as to cover the pockets and enclose the components therein.

45. The process of claim 44, wherein the wall and the bottom converge at a floor edge, and the floor edge is longitudinally spaced from the lead-tip vertical plane in an opposite direction from the midwall-rebound-reflection plane so as to be distinguishable by automated visual inspection from the lead-tip vertical plane.

46. The process of claim 44, wherein the components are to be inspected visually in longitudinal increments while in the carrier, and the midwall-rebound-reflection plane is spaced longitudinally from the lead-tip vertical plane by a distance exceeding a predetermined number of the longitudinal increments.

47. The process of claim 44, further comprising the step of, after placing one of the components in each pocket, visually inspecting the leads of the components.

48. The process of claim 44, wherein the pocket further comprises outwardly projecting transverse bulges at each longitudinal end of the pocket.

49. The process of claim 44, wherein the pocket further comprises a pedestal projecting from the pocket bottom, the pedestal including an upper surface, and the component is placed within the pocket so as to be supported by the upper surface.

50. The process of claim 49, wherein the upper surface of the pedestal extends partially across the pocket in a longitudinal direction, and the pedestal further includes a pair of fences projecting from the upper surface for limiting the movement of the component within the pocket, a different one of the fences being located at each longitudinal end of the pedestal.

51. The process of claim 49, wherein the pocket wall, the pocket bottom and the pedestal combine to define a trough at each longitudinal end of the pocket, the pocket being wider at each of the troughs than at the location of the pedestal.

* * * * *